United States Patent
Yokoyama et al.

(10) Patent No.: US 7,573,038 B2
(45) Date of Patent: Aug. 11, 2009

(54) RADIATION IMAGE PICKUP APPARATUS, RADIATION IMAGE PICKUP SYSTEM, THEIR CONTROL METHOD AND THEIR CONTROL PROGRAM

(75) Inventors: Keigo Yokoyama, Honjo (JP); Tadao Endo, Honjo (JP); Toshio Kameshima, Kumagaya (JP); Tomoyuki Yagi, Honjo (JP); Katsuro Takenaka, Saitama-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 384 days.

(21) Appl. No.: 11/502,541

(22) Filed: Aug. 11, 2006

(65) Prior Publication Data

US 2007/0040099 A1 Feb. 22, 2007

(30) Foreign Application Priority Data

Aug. 17, 2005 (JP) ............................. 2005-236773
Aug. 8, 2006 (JP) ............................. 2006-215855

(51) Int. Cl.
*H04N 5/32* (2006.01)
*H05G 1/64* (2006.01)

(52) U.S. Cl. .......................... 250/370.09; 348/E5.081; 378/98.8; 378/98.12

(58) Field of Classification Search ....................... None
See application file for complete search history.

(56) References Cited

U.S. PATENT DOCUMENTS

| | | | | |
|---|---|---|---|---|
| 5,923,722 A * | 7/1999 | Schulz | ....................... | 378/98.8 |
| 6,453,008 B1 * | 9/2002 | Sakaguchi et al. | ......... | 378/98.7 |
| 6,904,126 B2 | 6/2005 | Endo | ....................... | 378/98.8 |
| 6,952,015 B2 | 10/2005 | Kameshima | ........... | 250/370.11 |
| 6,952,464 B2 | 10/2005 | Endo | ....................... | 378/98.11 |
| 6,985,555 B2 | 1/2006 | Endo | ....................... | 378/98.11 |
| 7,002,157 B2 | 2/2006 | Kameshima | ........... | 250/370.11 |
| 7,012,260 B2 | 3/2006 | Endo | ..................... | 250/370.11 |
| 7,138,639 B2 | 11/2006 | Kameshima | ........... | 250/370.11 |
| 7,154,099 B2 | 12/2006 | Endo | ..................... | 250/370.11 |
| 7,227,926 B2 | 6/2007 | Kameshima et al. | ........ | 378/98.9 |
| 2004/0027472 A1 * | 2/2004 | Endo et al. | ................... | 348/308 |
| 2005/0056790 A1 * | 3/2005 | Spahn | .................... | 250/370.11 |
| 2005/0109927 A1 | 5/2005 | Takenaka et al. | ......... | 250/252.1 |
| 2005/0199834 A1 | 9/2005 | Takenaka et al. | ............ | 250/580 |
| 2005/0200720 A1 | 9/2005 | Kameshima et al. | ..... | 348/220.1 |
| 2005/0220269 A1 | 10/2005 | Endo et al. | ................... | 378/114 |
| 2005/0264665 A1 | 12/2005 | Endo et al. | ................... | 348/308 |
| 2006/0119719 A1 | 6/2006 | Kameshima | ................ | 348/308 |
| 2006/0192130 A1 | 8/2006 | Yagi | ...................... | 250/370.14 |

(Continued)

*Primary Examiner*—David P Porta
*Assistant Examiner*—Yara B Green
(74) *Attorney, Agent, or Firm*—Fitzpatrick, Cella, Harper & Scinto

(57) ABSTRACT

A radiation image pickup apparatus which selectively executes a first reading operation driving a detection unit irradiated with the radiation to read a first signal value, a second reading operation driving the detection unit without being irradiated with any radiations before the first reading operation to read a second signal value, and a third reading operation driving the detection unit without being irradiated with any radiations after the first reading operation to read a third signal value, and subtracts a signal value produced by the processing of the second signal value and the third signal value from the first signal value, thereby reducing an offset component and random noises without lowering a frame rate and its control method are provided.

11 Claims, 14 Drawing Sheets

U.S. PATENT DOCUMENTS

| | | | |
|---|---|---|---|
| 2006/0289774 A1 | 12/2006 | Endo et al. | 250/370.09 |
| 2007/0069144 A1 | 3/2007 | Kameshima | 250/370.09 |
| 2007/0080299 A1 | 4/2007 | Endo et al. | 250/370.09 |
| 2007/0096032 A1 | 5/2007 | Yagi et al. | 250/370.11 |
| 2007/0125952 A1 | 6/2007 | Endo et al. | 250/369 |
| 2007/0131843 A1 | 6/2007 | Yokoyama et al. | 250/205 |
| 2008/0166033 A1* | 7/2008 | Bueno et al. | 382/132 |

* cited by examiner

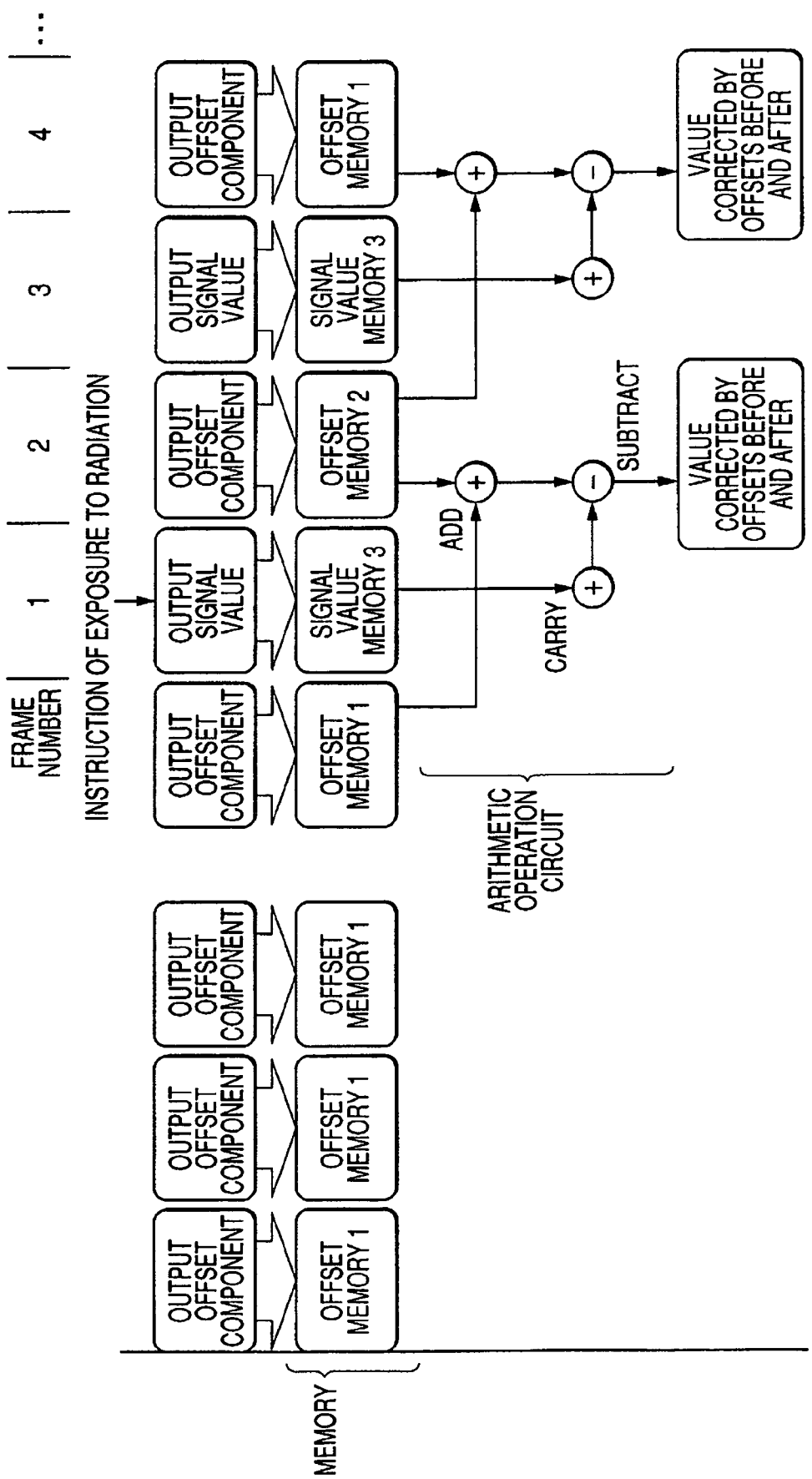

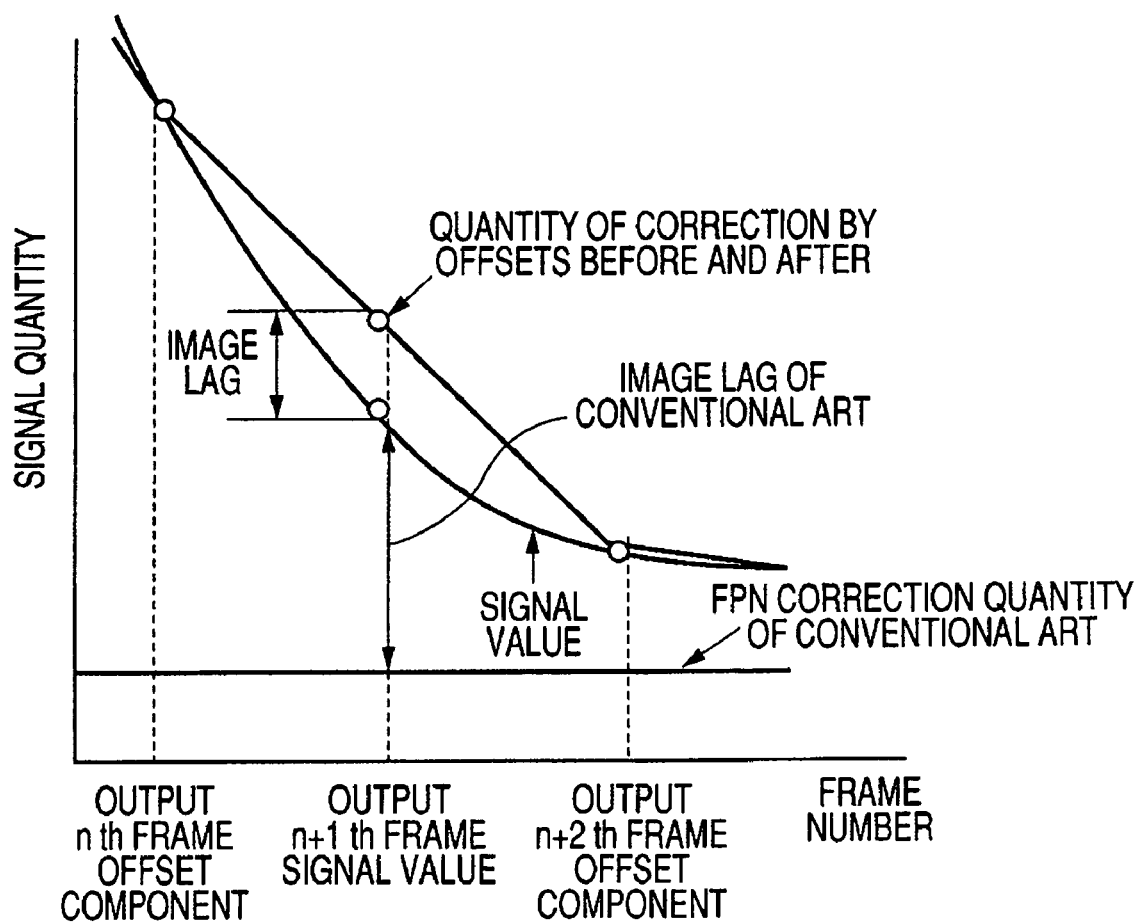

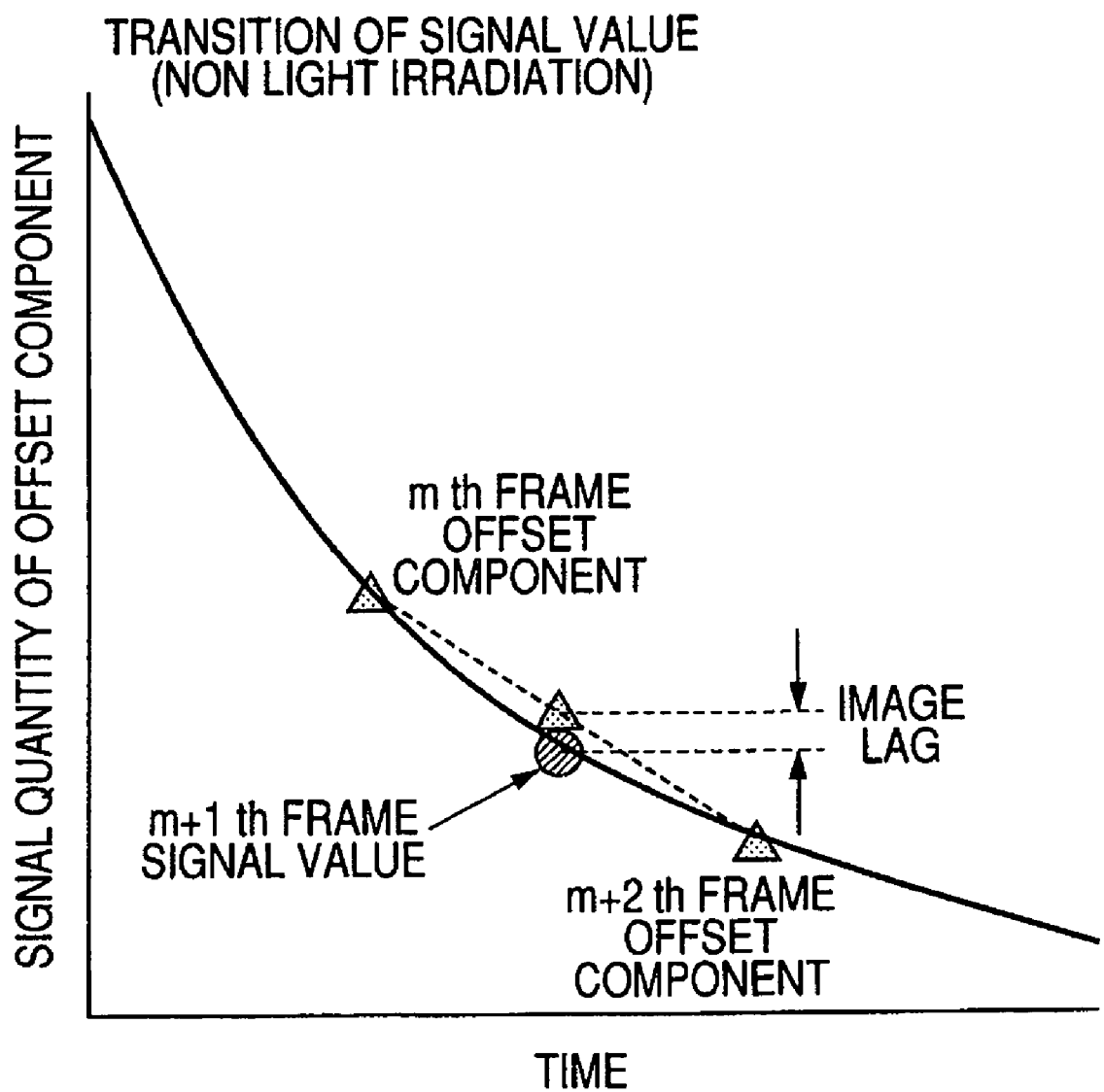

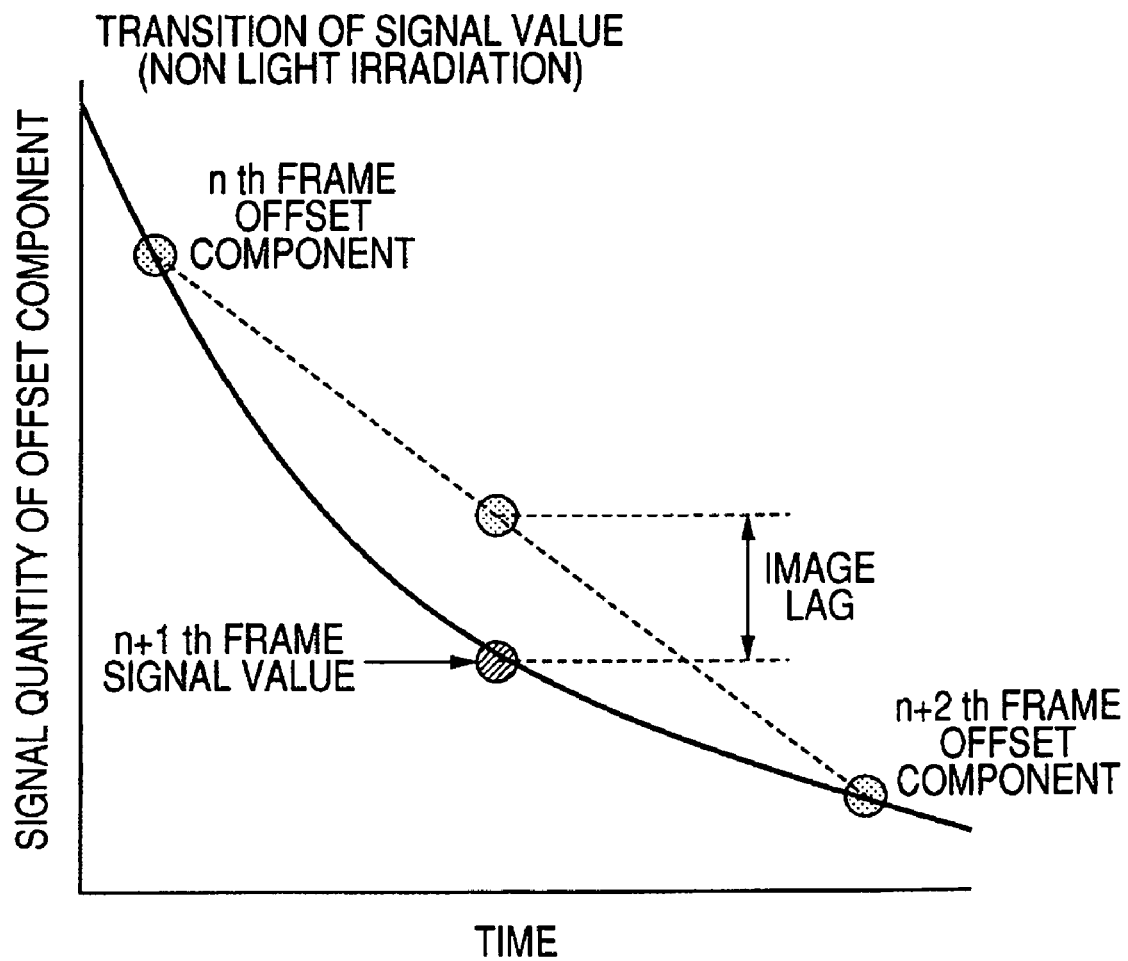

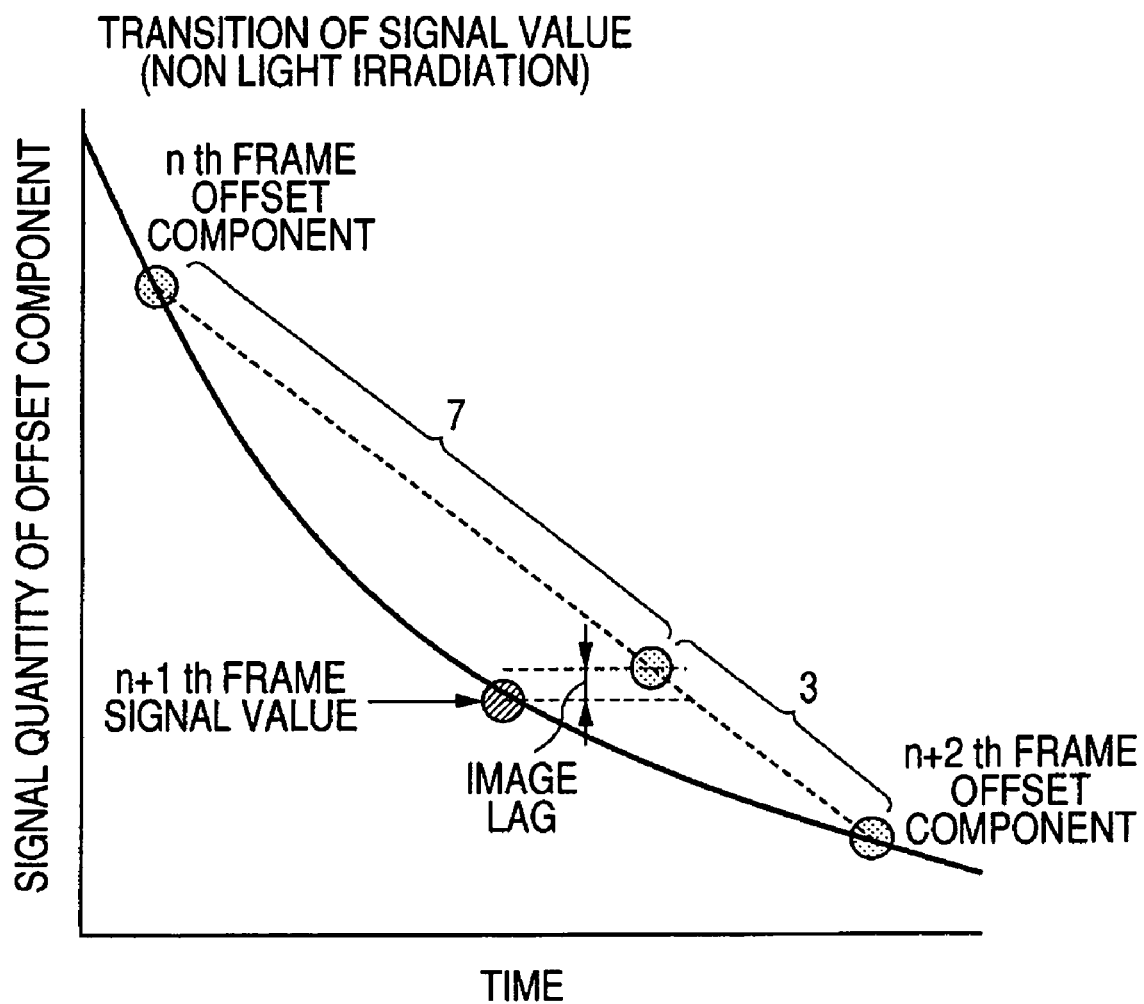

RADIATION IMAGE PICKUP APPARATUS, RADIATION IMAGE PICKUP SYSTEM, THEIR CONTROL METHOD AND THEIR CONTROL PROGRAM

BACKGROUND OF THE INVENTION

1. Field of the Invention

The present invention relates to a radiation image pickup apparatus and a control method thereof, each suitable for being used for medical diagnosis, industrial nondestructive inspection and the like. In addition, it is noted that the term "electromagnetic waves" as used herein is intended to encompass X-rays, γ-rays and the like, and rays of α or β particles as well.

2. Description of the Related Art

Recently, a radiation image pickup apparatus using a non-single crystal thin film semiconductor such as amorphous silicon or the like as a solid state image pickup device to be able to radiograph a still image has been put to practical use. Enlargement in area exceeding 40 cm square, which can cover the size of the chest of the human body, has been realized using a producing technique of amorphous silicon thin film semiconductors. Because the manufacturing process thereof is comparatively easy, it is expected that an inexpensive detection apparatus will be provided in the future. Moreover, because amorphous silicon can be produced to be a thin glass plate having a thickness of 1 mm or less, amorphous silicon has an advantage capable of being produced as a detector having a very small thickness. Moreover, it is possible to implement radiographing a still image and a moving image with one apparatus, and thus unnecessary to prepare two separate dedicated apparatus for those two applications.

Such a radiation image pickup apparatus includes a photoelectric conversion circuit equipped with a plurality of conversion elements converting radiation such as X-rays into an electric signal and switching elements arranged in a matrix, and a reading circuit for reading the electric signal from the photoelectric conversion circuit. Here, the conversion elements may be made of a material that converts radiation into an electric signal directly, or may be composed of wavelength converters each converting radiation into visible light and photoelectric conversion elements each converting the converted visible light into an electric signal.

When an image is radiographed by a radiation image pickup apparatus including solid state image pickup devices using amorphous Si, an actually read image includes offsets generated by the photoelectric conversion circuit and the reading circuit. Accordingly, it is necessary to remove the offset components included in the signal value.

SUMMARY OF THE INVENTION

It is known to perform the correction of offset components (hereinafter referred to as "offset correction") by subtracting the signal values ("dark signal values") of a dark output image including the offset components such as fixed pattern noises, dark component and the like from the signal values of an image acquired by an exposure to radiation. When it is supposed that the values obtained by the subtractions are corrected values, each of the corrected values can be acquired by the formula "corrected value=signal value−offset component." In addition, the offset components can be acquired by performing signal reading (reading operation for correction) from a converting circuit without performing any exposure to a radiation.

For instance, in moving image radiographing, an offset component has been previously acquired, and the signal value has been stored in a memory or the like before an exposure to radiation. Corrected values are acquired by subtracting the stored offset components from the signal values acquired in the following frames. Hereupon, it is supposed that an operation of acquiring an offset component one time is counted as one frame similarly to an operation of acquiring a signal value.

By the conventional method, first, an offset component is acquired just after a moving image radiographing start, i.e., just after an instruction to make an exposure to radiation. The acquired offset component is stored in an offset memory. After the completion of acquisition of the office component, the exposure to radiation is begun to acquire a signal value output, and the acquired signal value is stored in a signal value memory. After that, the previously acquired offset component is subtracted from the signal value in the signal value memory with a subtraction circuit to acquire a corrected value. In the following frames, the signal values are similarly acquired. However, the signal value memory used in the previous frame may be overwritten by the signal at this time.

However, an exact offset component cannot be acquired in the moving image radiographing including an exposure to radiation by the conventional method, and the conventional method has a problem in that an error in the actually acquired corrected value occurs. It is known that an actual signal value by a moving image radiographing includes an image lag component in addition to the image signal value output component and the offset component. Here, the term "image lag" means a component which remains apart from an image signal value output component even if the signal value is corrected by the offset correction. Consequently, the signal value can be expressed by the formula "signal value=image signal value output component+offset component+image lag." If the formula is rewritten, the formula "corrected value=signal value−offset component=image signal value output component+image lag" is acquired. As mentioned above, because the image lag remains in the corrected value by the prior art, the moving image deteriorates as compared with what is desirable.

When a positive image lag is generated after an offset acquisition in the conventional offset correction, a larger corrected value is output by the quantity of the image lag than the actual corrected value. That is, the conventional apparatus has a problem in that the image quality deteriorates in moving image radiographing owing to the influences of the image lag.

Moreover, when the standard deviation of random noises included in a signal value acquired by a normal reading operation is denoted by a letter $\sigma_1$ and the standard deviation of random noises included in an offset component acquired by a reading operation for correction is denoted by a letter $\sigma_2$, the standard deviation $\sigma_t$ of random noises included in a corrected value is expressed by the following formula 1:

$$\sigma_t = \sqrt{\sigma_1^2 + \sigma_2^2} \quad (1)$$

Also, the random noises increase by the random noises included in the offset component as compared with those before the correction.

In addition, a technique of reducing the random noises is disclosed in, for example, U.S. Pat. No. 6,904,126. U.S. Pat. No. 6,904,126 discloses a correction method of subtracting an average value of a plurality of dark outputs before an exposure to a radiation or an average value of a plurality of dark outputs after an exposure to a radiation from an image signal generated by the exposure to radiation.

However, the method of subtracting the average value of the plurality of dark outputs before the exposure to radiation cannot correct for the random noises generated by the exposure to radiation even if the method can correct for offset components. On the other hand, the method of subtracting the average value of the plurality of dark outputs after the exposure to radiation involves performing the steps of reading a plurality of dark outputs, averaging the read dark outputs and the like after the acquisition of the image information, and thus, even if the method can reduce the random noises, the time up to the output of the image is delayed. Hence, the delay of the image output becomes a problem especially at the time of the acquisition of a moving image. Moreover, also the frame rate thereof is lowered. Furthermore, U.S. Pat. No. 6,904,126 has no concept of the image lag, and cannot sufficiently correct for the image lag together with the random noises. In particular, when an amorphous material is used as a photoelectric conversion layer, carriers generated by photoelectric conversions are trapped at a trap level in the amorphous material. Consequently, many image lags are generated.

The present invention has been made in view of the problems mentioned above, and it is an object of the present invention to provide a radiation image pickup apparatus capable of reducing offset components and random noises without lowering the frame rate thereof, and a control method thereof.

The inventor of the present application has hit upon each aspect of the present invention which will be shown in the following as a result of zealous examinations in order to settle the problems mentioned above.

A radiation image pickup apparatus according to the present invention includes: a detection unit in which a plurality of conversion elements, each converting a radiation into charges, is two-dimensionally arranged; a driving circuit driving the detection unit; a reading circuit reading an electric signal based on the charges from the detection unit; a control unit selectively executing a first reading operation reading a first signal value by driving the detection unit, on which the radiation has been irradiated, a second reading operation reading a second signal value by driving the detection unit without being irradiated by any radiations before the first reading operation, and a third reading operation reading a third signal value by driving the detection unit without being irradiated by any radiations after the first reading operation; and a signal processing unit processing the electric signal output from the reading circuit, wherein the signal processing unit subtracts a signal value acquired by averaging processing of the second signal value and the third signal value from the first signal value.

A radiation image pickup system according to the present invention includes the radiation image pickup apparatus and a radiation generating unit, wherein the control unit controls operations of the radiation generating unit and the radiation image pickup apparatus to read a radiation image having transmitted a subject.

A control method of a radiation image pickup apparatus according to the present invention includes: a first reading step of reading a first signal value from a detection unit with a reading circuit by driving the detection unit irradiated by a radiation with a driving circuit, the detection unit including a plurality of conversion elements, which is two-dimensionally arranged and converts the radiation into charges; a second reading step of reading a second signal value from the detection unit with reading circuit by driving the detection unit with the driving circuit without being irradiated by any radiations before the first reading step; a third reading step of reading a third signal value form the detection unit with the reading circuit by driving the detection unit with the driving circuit without being irradiated by any radiations after the first reading step; and a step of subtracting a signal value produced by averaging the second signal value and the third signal value with a signal processing unit processing the electric signal output from the reading circuit.

A program according to the present invention is a program stored in a storing medium for making a computer control an operation of a radiation image pickup apparatus provided with a detection unit in which a plurality of conversion elements converting a radiation into charges is two-dimensionally arranged, a driving circuit driving the detection unit, a reading circuit for reading an electric signal based on the charges from the detection unit, and a signal processing unit processing the electric signal output from the reading circuit, wherein the program makes the computer selectively execute a first reading procedure of reading a first signal value from the detection unit with the reading circuit by driving the detection unit irradiated by the radiation with the driving circuit, a second reading procedure of reading a second signal value from the detection unit with the reading circuit by driving the detection unit with the driving circuit without being irradiated by any radiations before the first reading procedure, and a third reading procedure of reading a third signal value from the detection unit with the reading circuit by driving the detection unit with the driving circuit without being irradiated by any radiations after the first reading procedure, and the program makes the computer execute a procedure of subtracting a signal value produced by averaging processing of the second signal value and the third signal value from the first signal value with the signal processing unit.

According to the present invention, because the first signal value is corrected using the signal value acquired by averaging the second signal value and the third signal value before and after acquiring the first signal value, an image lag can be remarkably reduced. Moreover, because the increase of the random noises accompanying the correction is also suppressed, it is possible to acquire a radiation image of excellent image quality and reliability. Furthermore, the faster the frame rate acquiring the first to the third signal values is set to be, the more the image lag can be reduced.

Further features of the present invention will become apparent from the following description of exemplary embodiments with reference to the attached drawings.

BRIEF DESCRIPTION OF THE DRAWINGS

FIG. 7 is a flowchart showing the operation of the signal processing circuit unit of the radiation image pickup apparatus according to the present invention.

FIG. 8B is a graph showing the magnitudes of image lags.

FIG. 10A is a graph showing the magnitude of an image lag in the case of a fast frame rate in the radiation image pickup apparatus according to the present invention, FIG. 10B is a graph showing the magnitude of an image lag in the case of a slow frame rate in the radiation image pickup apparatus according to the present invention, and FIG. 10C is a graph showing the magnitude of an image lag in the case of the same frame rate as in FIG. 10A but with a modified weight ratio.

DESCRIPTION OF THE EMBODIMENTS

Figure 1:
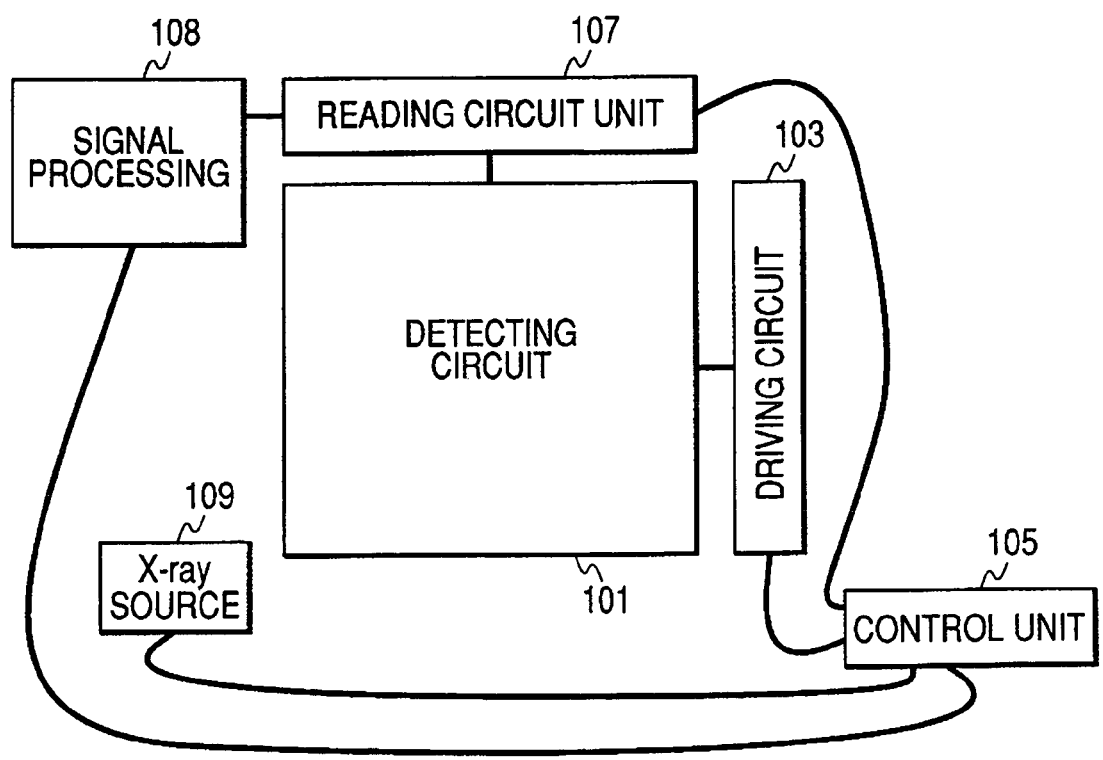
FIG. 1 is a schematic diagram showing a radiation image pickup apparatus according to the present invention.

Hereinafter, an embodiment of the present invention is concretely described with reference to the attached drawings. FIG. 1 is a diagram showing an X-ray image pickup apparatus (radiation image pickup apparatus) according to an embodiment of the present invention.

The radiation image pickup apparatus according to the present embodiment is provided with a detecting circuit unit 101, a driving circuit unit 103, an X-ray source (radiation generating apparatus) 109, a reading circuit unit 107, a signal processing circuit unit 108, and a control unit 105 performing the drive control of the X-ray source 109. Moreover, the radiation image pickup apparatus is configured so as to set, selectively and freely, a moving image radiographing mode and a still image radiographing mode. In addition, although descriptions will be given with reference to an X-ray image pickup apparatus in the present embodiment, the present invention is not limited to the X-ray image pickup apparatus. An α-particle ray, a β-particle ray, and a γ-ray and the like are included in the category of radiation.

Figure 2:
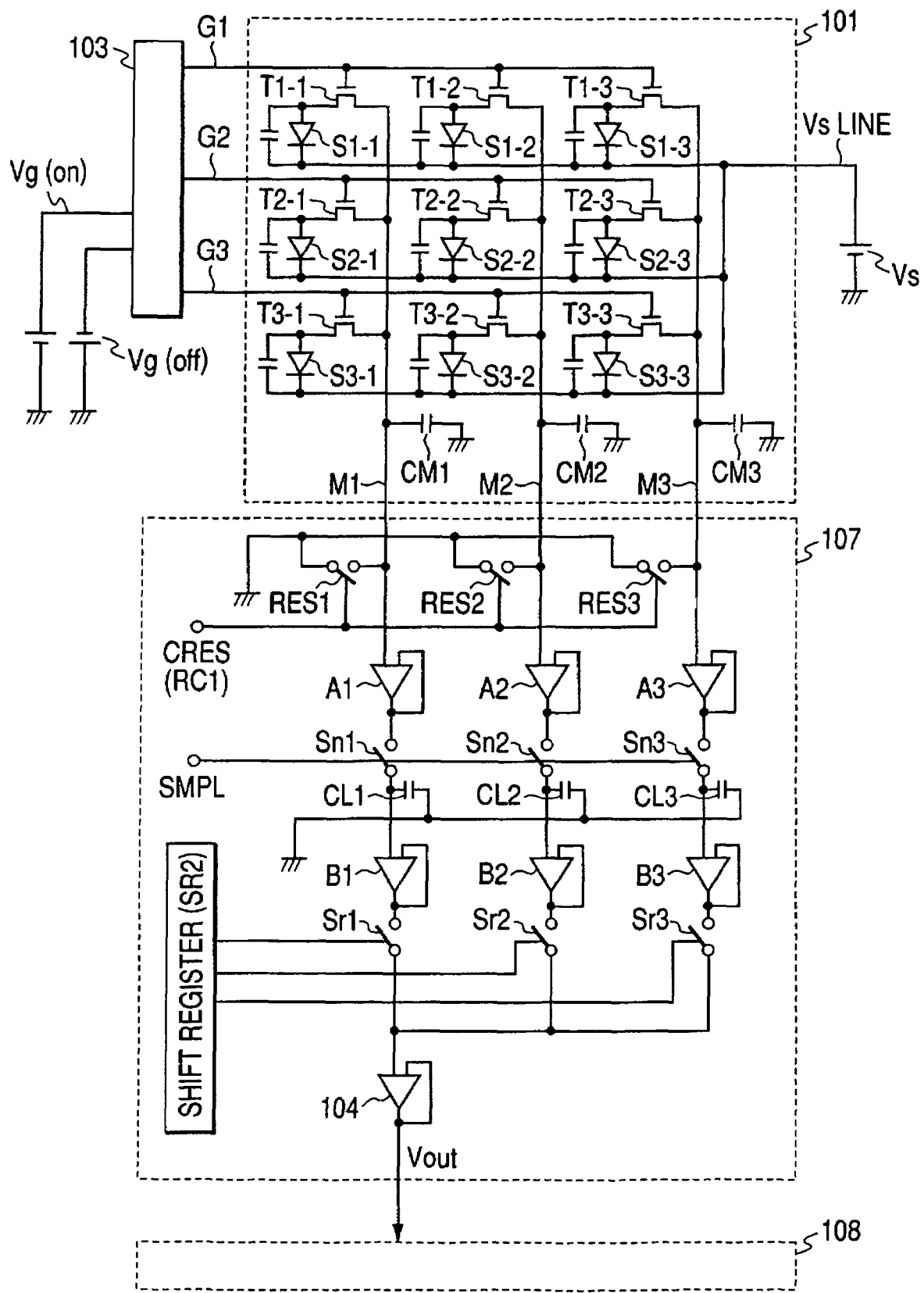
FIG. 2 is a schematic circuit diagram showing a flat panel detector included in the radiation image pickup apparatus of the present invention.

The circuit configuration of a flat panel detector including the detecting circuit unit 101, the driving circuit unit 103 and the reading circuit unit 107 is shown in FIG. 2. In addition, although conversion elements are shown only for 3×3 pixels for convenience' sake in FIG. 2, for example, about 2000× 2000 conversion elements are arranged in the detecting circuit unit 101.

In FIG. 2, reference marks S1-1 to S3-3 denote the photoelectric conversion elements constituting the conversion elements, and reference marks T1-1 to T3-3 denote switching elements (thin film transistors ("TFTs")). One pixel has the photoelectric conversion element S1-1 and the switching element T1-1. Moreover, wavelength converters (not shown) converting radiation such as X-rays into waves such as visible light having a wavelength which the photoelectric conversion elements S1-1 to S3-3 can detect are arranged on the incidence planes of the photoelectric conversion elements S1-1 to S3-3. The conversion elements include the wavelength converters and the photoelectric conversion elements S1-1 to S3-3. Reference marks G1-G3 denote gate wiring for turning on or off the switching elements T1-T3, reference marks M1-M3 denote signal wiring, and a Vs line is wiring for supplying a storage bias to the photoelectric conversion elements S1-1 to S3-3. In the present embodiment, the photoelectric conversion elements S1-1 to S3-3, the switching elements T1-1 to T3-3, the gate wiring G1-G3, the signal wiring M1-M3 and the Vs line are included in the detecting circuit unit 101. The Vs line is biased by a power source Vs. A reference numeral 103 denotes a driving circuit unit supplying a pulse voltage for a drive to the gate wiring G1-G3, and a voltage Vg switching the on or the off of the switching elements T1-1 to T3-3 is supplied from the outside of the driving circuit unit 103.

The reading circuit unit 107 amplifies parallel signal outputs of the signal wiring M1-M3 in the detecting circuit unit 101, and performs the serial conversion of the amplified parallel signal outputs to output a converted signal. Reference marks RES1-RES3 denote switches for resetting the signal wiring M1-M3, and reference marks A1-A3 denote amplifiers amplifying the signals of the signal wiring M1-M3. Reference marks CL1-CL3 denote sample-and-hold capacity, which temporarily stores the signals amplified by the amplifiers A1-A3, and reference marks Sn1-Sn3 denote switches for performing sample holds. Reference marks B1-B3 denote buffer amplifiers. Reference marks Sr1-Sr3 denote switches for performing serial conversions of parallel signals, and a reference mark SR2 denotes a shift register supplying pulses for performing serial conversions to the switches Sr1-Sr3. A reference numeral 104 denotes a buffer amplifier outputting a serially converted signal.

Figure 3:
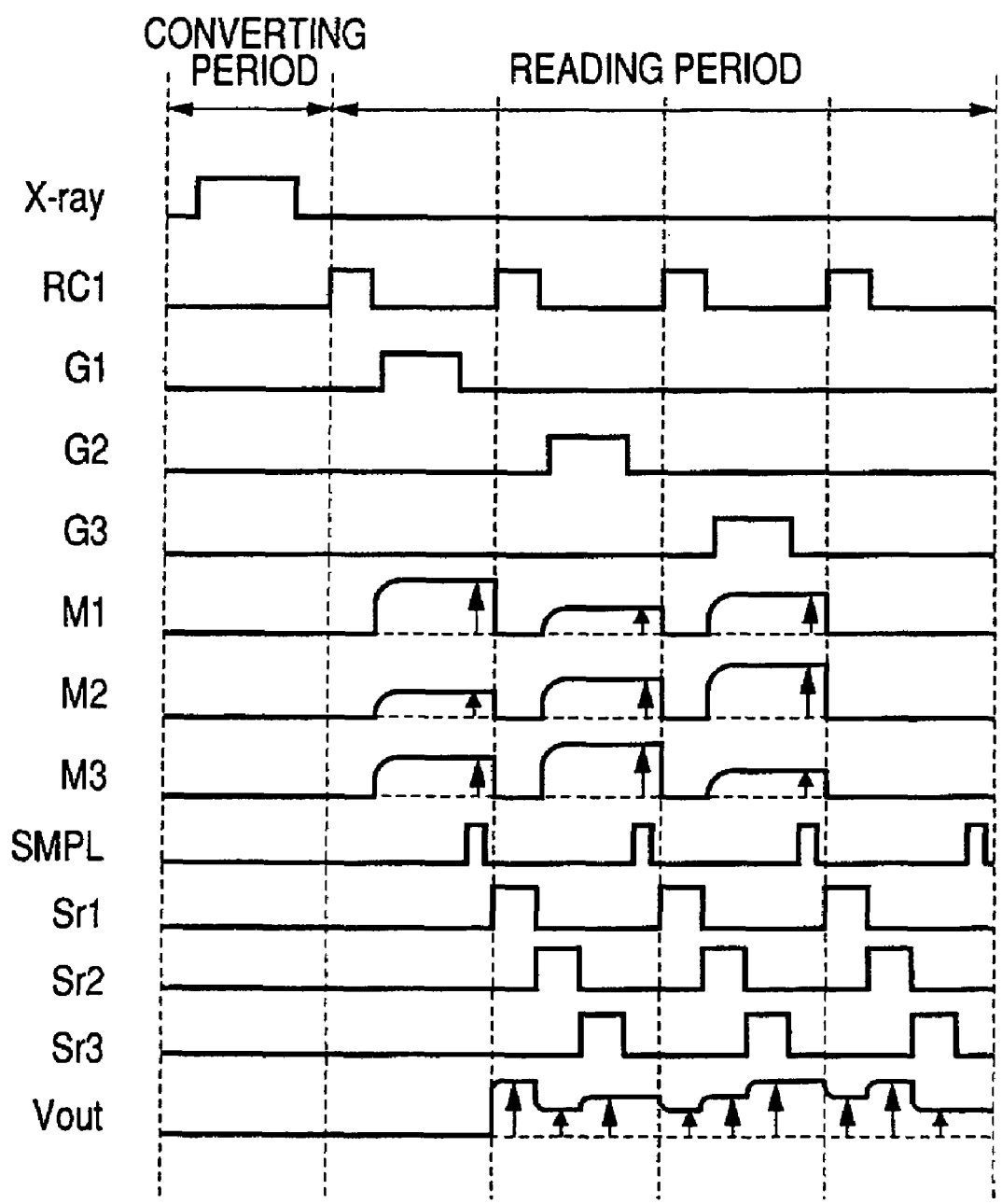
FIG. 3 is a timing chart showing an operation of the flat panel detector included in the radiation image pickup apparatus according to the present invention.

The operation of the radiation image pickup apparatus of the present embodiment is now described. FIG. 3 is a time chart showing the operation of the radiation image pickup apparatus of the present embodiment shown in FIG. 2.

First, description is given of a converting period (radiation irradiating period). In a state in which all of the switching elements T1-1 to T3-3 are off, the X-ray source 109 is turned on to emit a pulse. Then, light according to the radiation dose is irradiated from the wavelength converter (not shown) to each of the photoelectric conversion elements S1-1 to S3-3. The charges corresponding to the quantity of light received are converted by the photoelectric conversion elements S1-1 to S3-3, and the converted charges are accumulated in element capacitances. When the wavelength converters are used, it is only necessary to use a member of guiding visible light according to the radiation dose at the photoelectric conversion element side, or to arrange light emitting bodies in the very vicinity of the photoelectric conversion elements. In addition, even after the radiation source has completed emitting the radiation, the charges photoelectrically converted to the element capacitance are held.

Next, a reading period is described. A reading operation is performed in the order of the first line of the photoelectric conversion elements S1-1 to S1-3, the second line of the photoelectric conversion elements S2-1 to S2-3 next, and then the third line of the photoelectric conversion elements S3-1 to S3-3. First, in order to read the photoelectric conversion elements S1-1 to S1-3 in the first line, a gate pulse is supplied to the gate wiring G1 connected to the switching elements (TFT) T1-1 to T1-3 in the first line from the driving circuit unit 103. Thereby, the switching elements T1-1 to T1-3 in the first line are turned to be their on states, and the charges of the photoelectric conversion elements S1-1 to S1-3 in the first line are transmitted to the signal wiring M1-M3. Reading capacitances CM1-CM3 are added to the signal wiring M1-M3, and the charges are lead to be transmitted to the reading capacitances CM1-CM3 through the switching elements T1-1 to T1-3. For example, the reading capacitance CM1 added to the signal wiring M1 is the total sum (three pieces) of the interelectrode capacitances (Cgs) between the gates and the sources of the switching elements T1-1 to T3-1 connected to the signal wiring M1. The charges transmitted to the signal wiring M1-M3 are amplified by the amplifiers A1-A3, the amplified charges are transmitted to the capacity CL1-CL3, and the transmitted charges are held at the timing of turning off an SMPL signal.

Next, pulses are applied to the switches Sr1, Sr2 and Sr3 in the same order from the shift register SR2, and thereby the signals held by the capacitances CL1-CL3 are output from the amplifier 104 in the order of the capacitances CL1, CL2 and CL3. That is, the analog signal outputs of the buffer amplifiers B1, B2 and B3 are output from the amplifier 104. From this, the shift register SR2 and the switches Sr1-Sr3 are inclusively referred to as an "analog multiplexer". As a result, the signals according to the charges of the photoelectric conversion elements S1-1, S1-2 and S1-3 of one line are lead to be output one by one by the analog multiplexer. The reading operations of the photoelectric conversion elements S2-1 to S2-3 in the second line, and the reading operation of the photoelectric conversion elements S3-1 to S3-3 in the third line, are performed similarly.

If the sample holds of the signals of the signal wiring M1-M3 in the capacitances CL1-CL3 are performed with the SMPL signal of the first line, then the wiring M1-M3 is reset to the GND potential by a CRES signal, and a gate pulse on the gate wiring G2 can be applied after that. That is, while the serial conversion operation of the signals from the photoelectric conversion elements S1-1 to S1-3 in the first line is being performed, the charges of the photoelectric conversion elements S2-1 to S2-3 in the second line can be transferred to the signal wiring M1-M3 at the same time.

By the above operation, the charges according to the radiation, which have been generated in the photoelectric conversion elements S1-1 to S3-3 of all of the first to the third lines, can be output. Radiographing of a moving image is enabled by the repetition of such operations.

Figure 4:
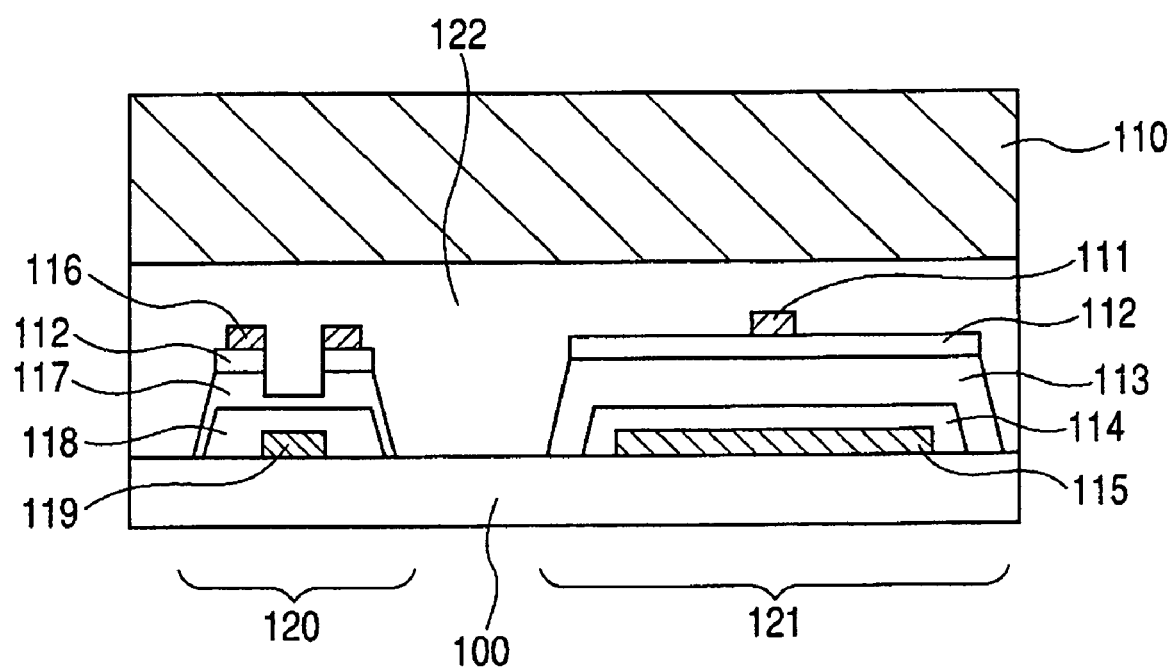
FIG. 4 is a sectional view of one pixel of the radiation image pickup apparatus according to the present invention.

Here, a description will be given of the cross-sectional structure of an MIS type photoelectric conversion element and a switching element (thin film transistor (TFT)) included in the detecting circuit unit 101. FIG. 4 is a sectional view showing the structure of an MIS type photoelectric conversion element and a thin film transistor. The MIS type photoelectric conversion element 121 and the TFT 120 are formed of amorphous Si as a main ingredient. In the portion in which the photoelectric conversion element 121 is formed, an anode side electrode 115 of the photoelectric conversion element 121, an insulating layer 114 made of SiN, a semiconductor layer 113 made of an i-type (intrinsic) amorphous Si, an impurity semiconductor layer 112 functioning as a hole blocking layer and made of an n-type amorphous Si, and a cathode side electrode 111 of the photoelectric conversion element 121 are formed in the order mentioned on an insulation substrate 100. On the other hand, in the portion in which a thin film transistor (TFT) 120 is formed, a TFT gate electrode 119, a gate insulating layer 118 made of SiN, a semiconductor layer 117 made of an i-type amorphous silicon, the impurity semiconductor layer 112 functioning as an ohmic contact layer made of an n-type amorphous Si, and source or drain electrodes 116 are formed in the order mentioned on the substrate 100. Here, the photoelectric conversion element 121 corresponds to the photoelectric conversion elements S1-1 to S3-3 of FIG. 2, and the thin film transistor 120 corresponds to the switching elements T1-1 to T3-3 of FIG. 2. And an insulating layer 122 covering the photoelectric conversion element 121 and the TFT 120 is formed, and a wavelength converter (scintillator) 110 converting radiation, such as X rays, into visible light is formed on the insulating layer 122. The wavelength converter 110 is made of a selected kind of, for example, $Gd_2O_3$, $Gd_2O_2S$ and CsI as a raw material.

In such a structure of the conversion element, radiation such as X rays is converted into a visible-light ray by the wavelength converter 110, and the visible-light ray is converted into charges by the photoelectric conversion element 121. In addition, the conversion element may be configured so as to have a function in which the photoelectric conversion element 121 absorbs radiation to convert the absorbed radiation into an electric signal directly, without the need for providing a wavelength converter 110. In this case, one kind selected from, for example, amorphous selenium, gallium arsenide, mercury iodide and lead iodide can be used as a material of the semiconductor layer of the conversion element. Moreover, the photoelectric conversion element 121 may be formed as a PIN-type photoelectric conversion element.

Figure 5:
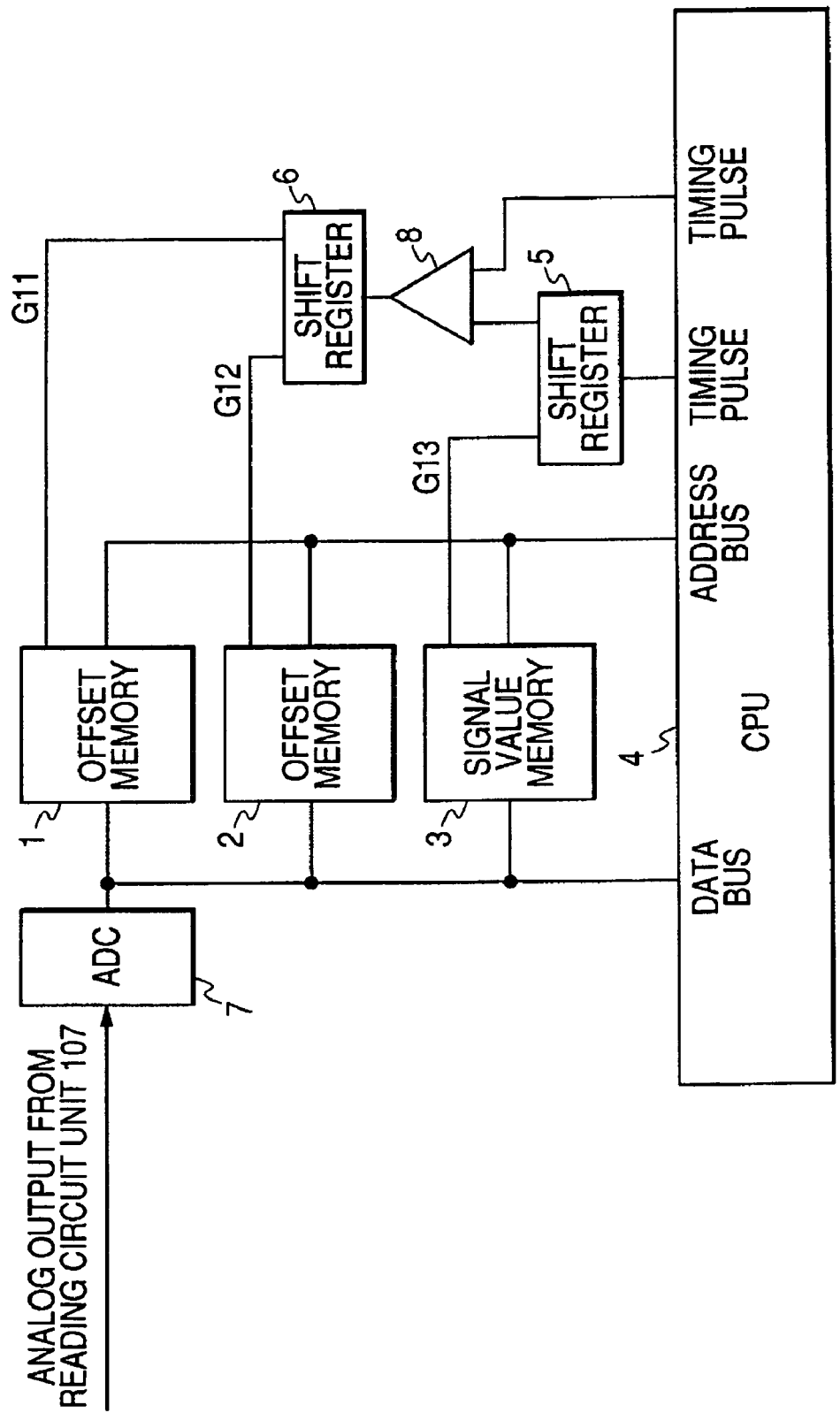
FIG. 5 is a block diagram showing the configuration of a signal processing circuit unit of the radiation image pickup apparatus according to the present invention.

Next, the signal processing circuit unit 108 is described. FIG. 5 is a block diagram showing the configuration of the signal processing circuit unit 108. The signal processing circuit unit 108 is provided with an AD converter ("ADC") 7 performing the digital conversion of an analog output from the reading circuit unit 107 and two offset memories 1 and 2 storing offset components for two times (dark output images). Moreover, a signal value memory 3 storing a signal value by a reading operation after an irradiation of a radiation is also provided. Moreover, there is provided a central processing unit (CPU) 4 which performs the generalization control of the whole signal processing circuit unit 108, and which performs signal processing, which will be described later, to the data stored in the offset memories 1 and 2 and the signal value memory 3. Furthermore, a shift register 5 into which a timing pulse is input from the CPU 4, an operational amplifier 8 to which a timing pulse from the CPU 4 and an output from the shift register 5 are input, and a shift register 6 to which an output from the operational amplifier 8 is input are provided.

Figure 6:
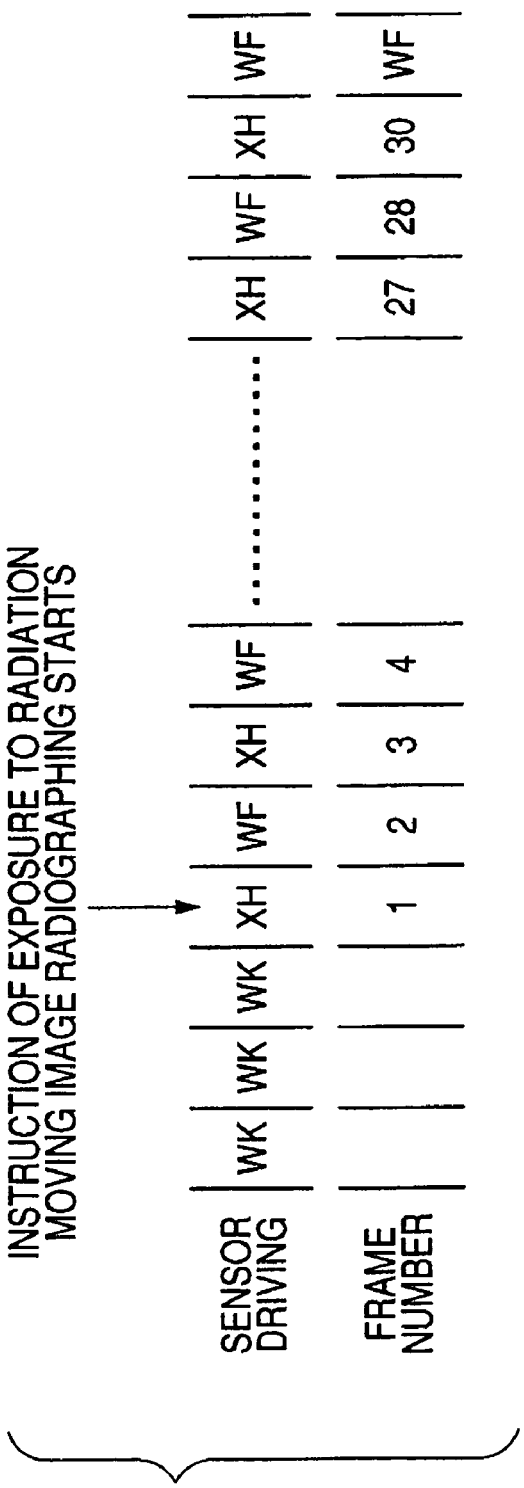
FIG. 6 is a timing chart showing a reading operation of the radiation image pickup apparatus according to the present invention.

Next, a reading operation (a drive method) in the present embodiment is described. FIG. 6 is a timing chart showing a reading operation. Hereupon, an example in which the frame number is 30 and the acquisition of an offset component ("FPN") and the acquisition of a signal value are alternately performed is shown. The direction facing to the right side on the paper indicates the lapse of time. In the timing chart, a radiation irradiating period is denoted by a letter "X", and a reading period is denoted by a letter "H". That is, the letter "H" denotes a period of a reading operation of a signal value, which is referred to as a "real reading period" or a "real reading operation". Although a period "W" has the same time scale as that of the X-ray irradiation period "X", the irradiation of X-rays is not performed at this timing. The period "W" is the period during which, so to speak, a dark current of a photoelectric conversion element is accumulated, and this period is referred to as a "wait period". Letters "K" and "F" denote reading operations after the wait periods, and the operation of the detecting circuit unit 101 in the periods K and F does not differ from their operation in the reading period "H". Although the operations in the periods "K" and "F" are mutually quite the same reading operations, the difference between them is whether the signal acquired by the reading operation is used as information for acquiring a radiation image or not. The period "K" is referred to as an "empty reading period" or an "empty reading operation", and the period "F" is referred to as an "offset component ("FPN") reading period" or an "offset component ("FPN") reading operation: The period "F" is adopted as the information from which a radiation image is acquired.

In FIG. 6, an acquisition of a signal value by an exposure to radiation and an acquisition of an offset component are alternately performed. First, the radiation image pickup apparatus alternately performs the operations in the periods "W" and "K." At this time, in an actual radiographing scene, for example, an X-ray engineer (radiographer) performs position adjustment of a part of the body of a patient (a person to be radiographed) on a radiation receiving surface of the detecting circuit unit 101. When the position adjustment of the patient has been completed in preparation for radiographing, the X-ray technician (radiographer) instructs the apparatus to effect an exposure to radiation. The radiation image pickup apparatus which has received this instruction performs the weight operation "W" and the empty reading operation "K" (although it is written as "K" for convenience's sake, it is actually "F") at the time, and performs the alternative acquisitions of signal values and offset components in the order "X", "H", "W", "F", "X" and so forth after that.

Next, the operation of the signal processing circuit unit 108 is described. FIG. 7 is a flowchart showing the operation of the signal processing circuit unit 108. The abscissa axis of FIG. 7 indicates the frame number of moving image radiographing, and the ordinate axis indicates the output from the reading circuit unit 107 and the processing operation in the signal processing circuit unit 108 in each frame.

First, before a moving image radiographing start (the frames which are performing the operations in the periods "K" in FIG. 6), a timing pulse is transmitted to a gate G11 using the shift registers 5 and 6, and the offset component outputs from the reading circuit unit 107 to the signal processing circuit unit 108 are stored in the offset memory 1. The offset component outputs from the reading circuit unit 107 are continuously overwritten in the offset memory 1 until an instruction for an exposure to radiation is issued. When the instruction for exposure to radiation is issued, an exposure to X-rays is started just after that, and a signal value output is acquired from the reading circuit unit 107.

A timing pulse is transmitted to a gate G13 using the shift register 5, and an acquired signal value is stored in the signal value memory 3. In the next frame, similarly to the above, a timing pulse is transmitted to a gate G12 using the shift registers 5 and 6 after the acquisition of the offset component, and the offset component output from the reading circuit unit 107 is stored in an offset memory 2. In this time, a signal value for correction is obtained by weighting the signal of the offset memory 1 and the signal of the offset memory 2 with 0.5 and by adding together the signals of the offset memories 1 and 2. And, an operation is conducted to subtract the signal valued for correction form the signal value of the signal value memory. In contrast, in the case of simple averaging processing, the offset signals 1 and 2 are added together, and subtracted from a carry digit (multiplied by 2). Thus, the load of the CPU is reduced. As the weighting operation, a method with varying the weight for the offset signals 1 and 2 according to a frame rate of a photographing, or a method with a constant weight for the offset signals 1 and 2 fixed independently of the frame rate of the photographing may be selected. The subtracted value is set as a corrected value, and corrected values are acquired by similar procedure hereinafter. Because the correction method performs the correction using the offset components before and after the acquisition of the signal of an X-ray image, the method is called a "correction by offsets before and after".

In addition, as described above, the signal processing in the detecting circuit unit 101, the driving circuit unit (shift register) 103 and the reading circuit unit 107 while the signal processing is being performed is similar to the signal processing shown in FIGS. 2 and 3.

Figure 8A:
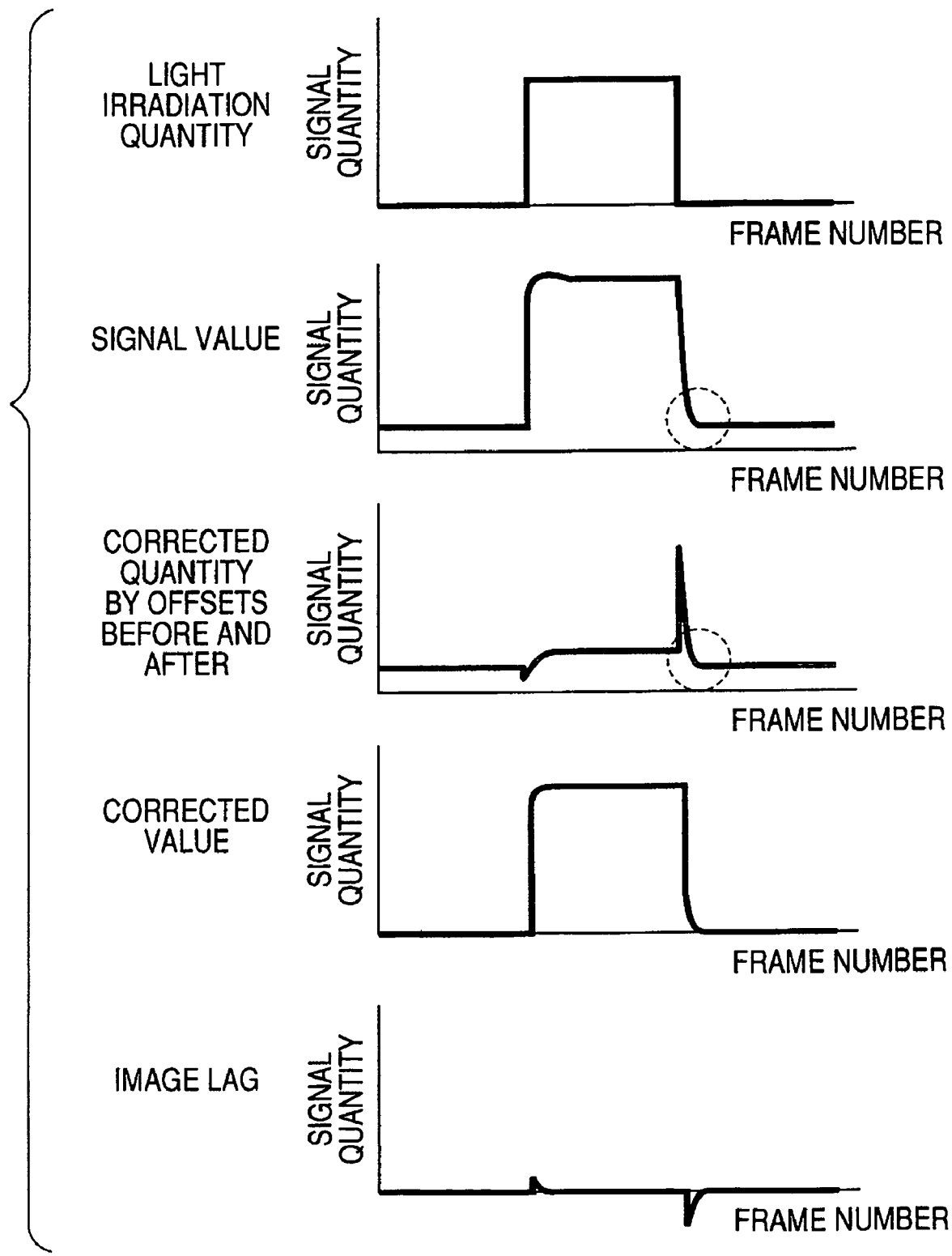
FIG. 8A is a diagram showing a signal value, a corrected quantity by offsets, a corrected value and an image lag to each frame number when the radiation image pickup apparatus according to the present invention is irradiated by a rectangular pattern of radiation (light)
Figure 9:
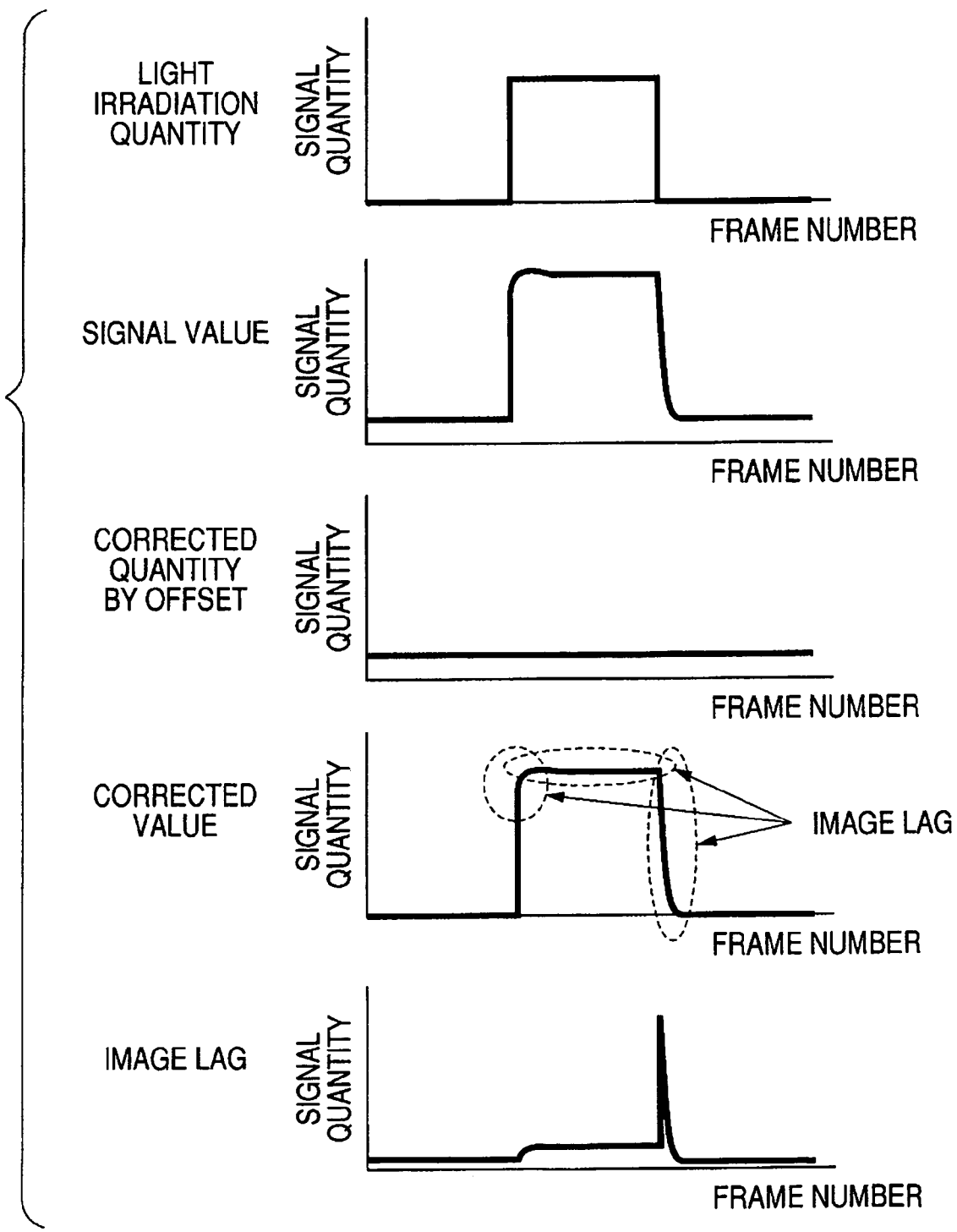
FIG. 9 is a diagram showing a signal value, a corrected quantity by offset, a corrected value and an image lag to each frame number when a conventional radiation image pickup apparatus is irradiated by a rectangular pattern of radiation (light).

According to the present embodiment, as compared with the conventional radiation image pickup apparatus, image lags can be remarkably reduced. That is, in the conventional radiation image pickup apparatus, large image lags are generated immediately before and immediately after an input of a rectangular beam when the radiation image pickup apparatus receives a rectangular-pattern light signal (X-ray signal). On the contrary, when a rectangular light signal is received while the signal processing shown in FIG. 7 is being implemented as the present embodiment, the image lags are reduced as shown in FIGS. 8A and 8B. In addition, FIG. 8A shows the signal values of each frame number related to a signal value, corrected quantities by offsets before and after, a corrected value and image lags when a rectangular light beam is irradiated. Moreover, for comparison, FIG. 9 shows the signal values of each frame number related to a signal value, a corrected quantity by offset, a corrected value and an image lag of the conventional radiation image pickup apparatus.

Especially, if the image lag immediately after the completion of the light irradiation (radiation irradiation) is observed in FIGS. 8A and 8B, the conventional method performs the correction to the offset component output including the offset component (FPN) acquired in advance as the main component. On the other hand, in the present embodiment, the correction is performed using a corrected value of the offset component outputs acquired immediately before and immediately after a signal value including radiation (X-ray) image information as the corrected quantity by before and after offset correction. Consequently, the present embodiment can perform the correction exactly by detecting a signal value including image lag components to be generated despite there being no radiation (light) inputs after an end of an irradiation (light irradiation), and thereby the embodiment can remarkably reduce the image lags.

Furthermore, as shown in FIGS. 10A and 10B, the faster the frame rate is at the time of moving image radiographing, the more an image lag is reduced. In FIGS. 10A and 10B, similarly to FIGS. 8A and 8B, the signal value including image lag components to be generated despite there being no light inputs after an end of an irradiation is observed. Here, referring to FIGS. 10A and 10B, the offset component derived just before the photographing and the offset component derived just after the photographing are added together, with weighting ratio 1:1 (0.5:0.5) (i.e., averaging), and are subtracted form the signal value. Here, a frame rate A (in FIG. 10A) is twice as fast as a frame rate B (in FIG. 10B), and it is known that an image lag generated at the frame rate A, the faster frame rate, is less than that at the frame rate B. Because the signal value including image lag components changes according to the lapse of time when the frame rate becomes faster, the acquisition of the offset component outputs and the acquisition of the signal value are performed within a shorter time period, and corrected values are acquired in a short time. This fact brings about the reduction of the image lags. Consequently, the correction method (the method of correction by offset before and after) adopted by the present embodiment can be said to be able to reduce the image lags furthermore by raising the frame rate. By means of a most suitable weighting, an image lag can be removed. In FIG. 10C, the frame rate is the same as that in FIG. 10A. In FIG. 10C, the offset signals derived before and after are added together with weighting ratio 3:7 (0.3:0.7) to derive the correction signal. And, the correction signal is subtracted from the signal value. Thereby, the image lag can be reduced more than that in FIG. 10A.

The random noises included in the corrected value acquired according to the present embodiment are described, supposing that a standard deviation of the random noises included in a signal value acquired by a normal reading operation is denoted by a letter $\sigma_1$ and a standard deviation of the random noises included in an offset component output obtained by a reading operation for correction is denoted by a letter $\sigma_2$. When the weight of offset component just before the photographing is a, and the weight of offset component just after the photographing is b, a standard deviation $\sigma_t$ of the random noises included in the corrected values by offsets before and after according to the present embodiment is expressed by the following formula 2:

$$\sigma = \sqrt{\sigma_1^2 + \sigma_2^2 \times \frac{(a^2 + b^2)}{(a+b)^2}} \quad (2)$$

$$\frac{a^2 + b^2}{(a+b)^2} \leq 1$$

In particular, when the offset components just before and after the photographing are added together with weighting ratio 1:1 (0.5:0.5), the standard deviation $\sigma_t$ of the random noises is expressed by the following formula 3:

$$\sigma_t = \sqrt{\sigma_1^2 + \sigma_2^2/2} \quad (3)$$

Consequently, according to the present embodiment, it is also possible to reduce random noises.

Figure 11:
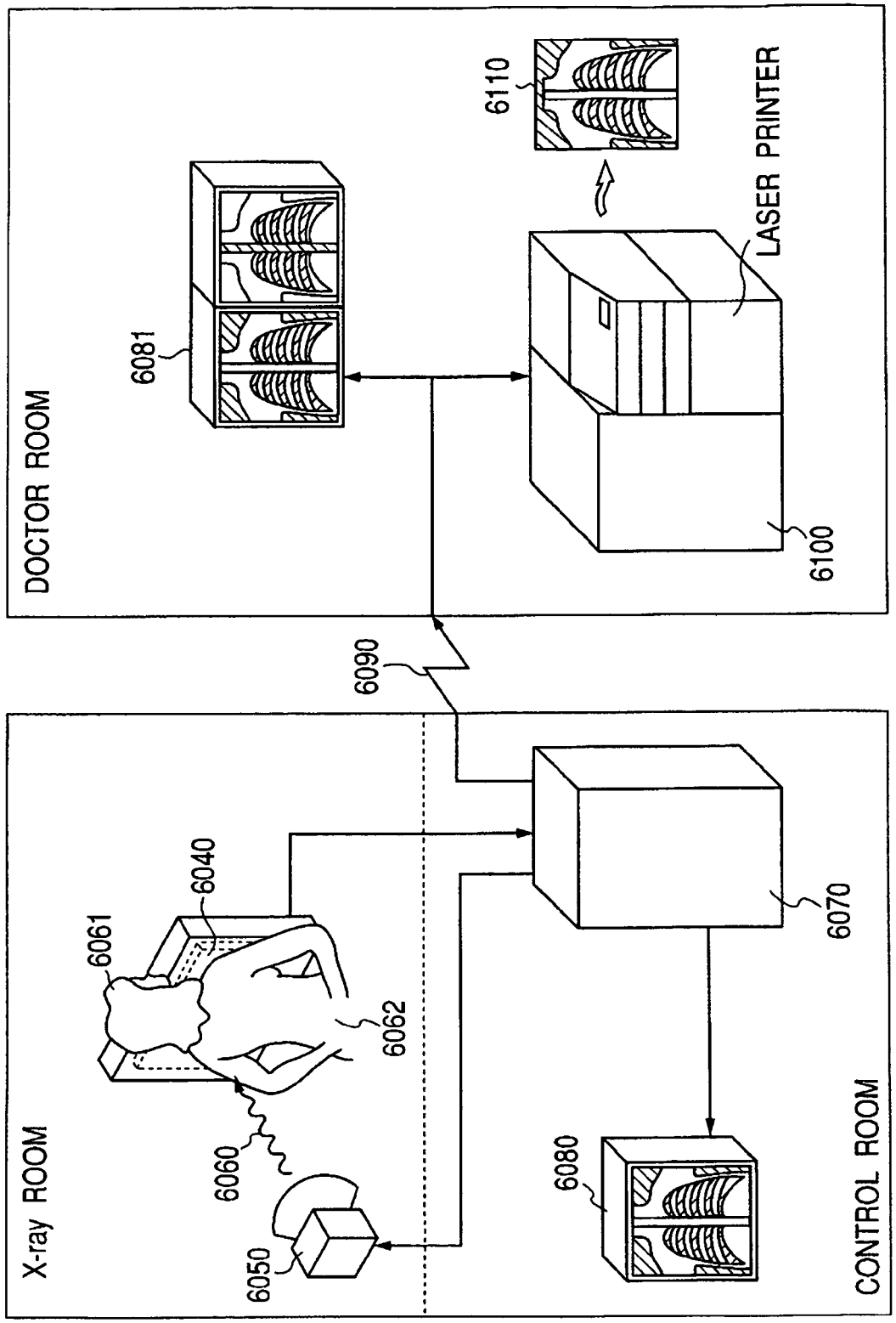
FIG. 11 is a schematic view showing the configuration of a radiation image pickup system using the radiation image pickup apparatus of the present invention.

Next, the application example of the radiation image pickup apparatus according to the embodiment of the present invention to a radiation image pickup system is described. FIG. 11 is a schematic view showing the configuration of a radiation image pickup system.

An X-ray beam 6060 generated by an X-ray tube 6050 (X-ray source 109) is transmitted through the chest 6062 of a patient or subject, 6061, and enters an image sensor 6040 provided with a radiation image pickup apparatus according to the embodiment of the present invention therein. The image sensor 6040 includes the detecting circuit unit 101, the driving circuit unit 103, the reading circuit unit 107 and the signal processing circuit unit 108 of the above embodiment. The X-ray beam includes the information of the inside of the body of the patient 6061. A scintillator (phosphor) emits light in correspondence with the incidence of the X-rays, and the photoelectric conversion element of the detecting circuit unit 101 performs the photoelectric conversion of the emitted light to acquire electric information. The image sensor 6040 outputs the information to an image processor 6070 as an electric signal (digital signal). The image processor 6070 as image processing means performs image processing to the received signal to output the processed signal to a display 6080 as the display means in a control room. A user observes the image displayed on the display 6080, and can acquire the information about the interior of the body of the patient 6061. In addition, the image processor 6070 also has a function of control means, and can switch the radiographing mode of a moving image/still image, or can perform control of the X-ray tube (radiation generating apparatus) 6050. That is, the image processor 6070 also functions as the control unit 105 in the above embodiment.

Moreover, the image processor 6070 can also transfer an electric signal output from the image sensor 6040 to a remote place through transmission processing means such as a telephone line 6090 and the like to display an image based on the electric signal on display means (display) 6081 located at another place such as a doctor's office. Moreover, it is also possible to save the electric signal output from the image sensor 6040 into recording means such as an optical disk to perform a diagnosis by a doctor at a remote place using the recording means. Moreover, it is also possible to record the electric signal in a film 6110 with a film processor 6100 used as recording means.

In addition, the structure of the photoelectric conversion element of the present invention is not specially limited. For example, a photoelectric conversion element which is made of amorphous silicon as the main raw material and absorbs visible light from a wavelength converter that converts radiation into visible light to convert the absorbed visible light into an electric signal may be used. As such an element, for example, a PIN-type photoelectric conversion element including a p layer, in which accepter impurities are doped, an i layer, which is an intrinsic semiconductor layer, and an n layer, in which donor impurities are doped, can be cited. Moreover, there can be cited an MIS-type photoelectric conversion element including a metal thin film layer formed on a substrate, an insulating layer, which is formed on the metal thin film layer and is made of amorphous silicon nitride preventing the passage of electrons and holes, a semiconductor layer, which is made of hydrogenated amorphous silicon formed on the insulating layer, an n-type impurity semiconductor layer, which is formed on the semiconductor layer and prevents the injection of holes, and a conductive layer formed on the impurity semiconductor layer. In the MIS-type photoelectric conversion element, the conductive layer may be a transparent conductive layer, and the conductive layer may be formed in a part of the injection preventing layer. When these photoelectric conversion elements are used as the conversion element and a wavelength converter is needed, as the wavelength converter, for example, a phosphor made of $Gd_2O_2S$, $Gd_2O_3$ or CsI as the main components can be used. Furthermore, a device which includes amorphous selenium, gallium arsenide, lead iodide, or mercury iodide as a material of a semiconductor layer, and absorbs an irradiated radiation to convert the absorbed radiation into an electric signal directly without using any wavelength converters may be used as the conversion element.

Moreover, the structure of the reading circuit unit 107 is not particularly limited, either. For example, the structure including amplifying means for amplifying a signal read from the detecting circuit unit 101, accumulating means for accumulating the signal amplified by the amplifying means, and serial conversion means for performing the serial conversion of the signal accumulated by the accumulating means can be used.

In addition, the embodiment of the present invention can be realized by the execution of a program by a computer, for example. Moreover, the means for supplying a program to a computer, for example, a storing medium such as a CD-ROM, which has recorded such a program and can be read by a computer, or a transmitting medium such as the Internet, which transmits such a program, can be applied as an embodiment of the present invention. Moreover, the above program may be also applied as an embodiment of the present invention. The program, the storing medium, the transmitting medium and the program product are included in the category of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims priority from Japanese Patent Applications Nos. 2005-236773, filed on Aug. 17, 2005, and 2006-215855, filed on Aug. 8, 2006, which are hereby incorporated by reference herein.

What is claimed is:

1. A radiation image pickup apparatus for photographing a radiation image comprising:
   a detection unit in which a plurality of conversion elements, each converting radiation into charges, are two-dimensionally arranged;
   a driving circuit for driving said detection unit;
   a reading circuit for reading an electric signal based on the charges from said detection unit;
   a control unit for controlling said detection unit, said driving circuit and said reading circuit, wherein said control unit selectively executes a first reading operation reading a first signal value from said detection unit on which the radiation has been irradiated, a second reading operation reading a second signal value from said detection unit without being irradiated by the radiation before the first reading operation, and a third reading operation reading a third signal value from said detection unit without being irradiated by the radiation after the first reading operation; and
   a signal processing unit processing the electric signal output from said reading circuit, wherein said signal processing unit subtracts a signal value acquired by the second signal value and the third signal value from the first signal value, and
   wherein said signal processing unit subtracts, from the first signal value, the signal value derived by adding together the second signal value and the third signal value with weighting according to a frame rate of the photographing.

2. The radiation image pickup apparatus according to claim 1, wherein said signal processing unit subtracts a signal value acquired by averaging the second signal value and the third signal value from the first signal value.

3. The radiation image pickup apparatus according to claim 1, wherein said signal processing unit includes first storing means for storing the first signal value, second storing means for storing the second signal value, and third storing means for storing the third signal value.

4. The radiation image pickup apparatus according to claim 1, wherein said signal processing unit includes storing means for storing the signal value acquired by the second signal value and the third signal value.

5. The radiation image pickup apparatus according to claim 1, wherein said conversion elements severally include a wavelength converter that converts radiation into light, and a photoelectric conversion element converts the light into the charges.

6. The radiation image pickup apparatus according to claim 5, wherein said wavelength converter includes a kind selected from $Gd_2O_3$, $Gd_2O_2S$ and CsI as a raw material.

7. The radiation image pickup apparatus according to claim 5, wherein said photoelectric conversion element includes a semiconductor layer formed on an insulating substrate, said semiconductor layer being made of amorphous silicon as a main ingredient.

8. The radiation image pickup apparatus according to claim 1, wherein said detection unit includes a plurality of two-dimensionally arranged pixels including said conversion elements and switching elements corresponding to said conversion elements.

9. A radiation image pickup system comprising:
   said radiation image pickup apparatus according to claim 1; and
   radiation generating means, wherein said control unit controls operations of said radiation generating means and said radiation image pickup apparatus to read a radiation image having transmitted a subject.

10. A control method of a radiation image pickup apparatus for photographing a radiation image comprising:
    a first reading step of reading a first signal value from a detection unit with a reading circuit by driving the detection unit irradiated by radiation with a driving circuit, the detection unit including a plurality of conversion elements, which are two-dimensionally arranged and convert the radiation into charges;
    a second reading step of reading a second signal value from the detection unit with the reading circuit by driving the detection unit with the driving circuit without being irradiated by any radiation before said first reading step;
    a third reading step of reading a third signal value from the detection unit with the reading circuit by driving the detection unit with the driving circuit without being irradiated by any radiation after said first reading step; and
    a step of subtracting a signal value acquired by the second signal value and the third signal value from the first signal value with a signal processing unit processing the electric signal output from the reading circuit, wherein there is subtracted, from the first signal value, the signal value derived by adding together the second signal value and the third signal value with weighting according to a frame rate of the photographing.

11. A computer-readable storage medium encoding, in executable form, a program for making a computer control an operation of a radiation image pickup apparatus for photographing a radiation image provided with a detection unit in which a plurality of conversion elements converting a radiation into charges is two-dimensionally arranged, a driving circuit driving the detection unit, a reading circuit for reading an electric signal based on the charges from the detection unit, and a signal processing unit processing the electric signal output from the reading circuit, wherein
    said program makes the computer selectively execute a first reading procedure of reading a first signal value from the detection unit with the reading circuit by driving the detection unit irradiated by the radiation with the driving circuit, a second reading procedure of reading a second signal value from the detection unit with the reading circuit by driving the detection unit with the driving circuit without being irradiated by any radiations before said first reading procedure, and a third reading procedure of reading a third signal value from the detection unit with the reading circuit by driving the detection unit with the driving circuit without being irradiated by any radiations after said first reading procedure, and
    said program makes the computer execute a procedure of subtracting a signal value acquired by the second signal value and the third signal value from the first signal value with the signal processing unit, wherein the signal processing unit subtracts, from the first signal value, the signal value derived by adding together the second signal value and the third signal value with weighting according to a frame rate of the photographing.

* * * * *